United States Patent [19]
Sakamoto

[11] Patent Number: 5,436,495
[45] Date of Patent: Jul. 25, 1995

[54] DEVICE ISOLATION AREA STRUCTURE IN SEMICONDUCTOR DEVICE

[75] Inventor: Mitsuru Sakamoto, Tokyo, Japan

[73] Assignee: NEC Corporation, Tokyo, Japan

[21] Appl. No.: 203,758

[22] Filed: Mar. 1, 1994

Related U.S. Application Data

[63] Continuation of Ser. No. 883,485, May 15, 1992, abandoned.

[30] Foreign Application Priority Data

May 17, 1991 [JP] Japan ................... 3-112025

[51] Int. Cl.⁶ ............... H01L 27/04; H01L 27/01; H01L 27/12; H01L 27/13
[52] U.S. Cl. .................. 257/506; 257/52; 257/501; 257/505; 257/507; 257/519; 257/349
[58] Field of Search ................ 257/52, 57, 60, 61, 257/285, 349, 506, 349, 501, 505, 507, 519

[56] References Cited

U.S. PATENT DOCUMENTS

| | | | |
|---|---|---|---|
| 4,199,384 | 4/1980 | Hsu | 148/174 |
| 4,570,325 | 2/1986 | Higuchi | 257/506 |
| 4,682,408 | 7/1987 | Takebayashi | 257/506 |
| 4,720,756 | 1/1988 | Takafuji et al. | 357/23.7 |
| 4,868,136 | 9/1989 | Ravaglia | 257/506 |
| 5,005,056 | 4/1991 | Motai et al. | 357/2 |
| 5,017,980 | 5/1991 | Gill et al. | 357/23.5 |
| 5,034,340 | 7/1991 | Tanaka et al. | 437/41 |
| 5,241,211 | 8/1993 | Tashiro | 257/506 |

Primary Examiner—Rolf Hille
Assistant Examiner—Valencia Martin Wallace
Attorney, Agent, or Firm—Burns, Doane, Swecker & Mathis

[57] ABSTRACT

A device isolation area structure in a semiconductor device is composed of two layers of a first device isolation film formed by selectively oxidizing a surface of a silicon substrate, and a second device isolation region formed in a single crystal silicon film covering the first device isolation film. A guard band region may be formed within the semiconductor substrate and immediately below the first device isolation film so as to be in contact with the first device isolation film. The device isolation area structure is suitable to high integration of the semiconductor device and provides less possibilities of occurrence of crystal defects.

9 Claims, 5 Drawing Sheets

DEVICE ISOLATION AREA STRUCTURE IN SEMICONDUCTOR DEVICE

This application is a continuation of application Ser. No. 07/883,485, filed May 15, 1992 now abandoned.

BACKGROUND OF THE INVENTION (1) Field of the Invention

The present invention relates to a semiconductor device and, more particularly, to a structure of a device isolation area in the semiconductor device.

(2) Description of the Related Art

Conventionally, if a semiconductor substrate is made of silicon (Si), the most widely used structure of the isolation area between the devices constituting a semiconductor device is a LOCOS (Local Oxidation of Silicon) structure. As shown in FIG. 1, this LOCOS structure comprises field oxide films formed by selectively oxidizing the surface of the silicon substrate. For example, with a P-type silicon substrate, the LOCOS structure is formed in such a way that boron (B) is selectively ion-implanted into the surface of the silicon substrate 401 to form channel stopper regions 404, and selective oxidation is performed to form silicon oxide films 405 having a thickness of 500 nm or so on the channel stopper regions 404.

With development of high integration and high density in semiconductor devices, a miniaturized structure has been required for the isolation area between devices or elements. In order to relax the lower limit of the size of the device isolation area due to the bird's beak of LOCOS or to prevent crystal defects from being produced, several LOCOS structures which are generally called modified LOCOSs have been proposed.

Further, new device isolation area structures which are more suitable for device miniaturization have been also proposed. Among them, particularly, a trench type device isolation area structure in which a trench or groove is formed on a semiconductor substrate surface has been researched. This technique is to form a trench on a semiconductor substrate, form insulating films on the side walls and fill the trench with insulating material.

It should be noted that the semiconductor device having the device isolation area structure as described above has the following problems.

With the LOCOS structure (or modified LOCOS structure), a semiconductor device comprising MOS transistors as shown in FIG. 2 are fabricated as follows. After the structure shown in FIG. 2 has been made, gate oxide films, gate electrodes 410, source/drain regions 411a, 411b and an interlayer film 412 are formed. After contact holes reaching the source/drain regions 411a, 411b have been opened, electrode wirings 413 and then a covering film 414 are formed. In the above process, the source/drain regions 411a and 411b and the device isolation areas 405 are formed so as to be substantially coplanar. Thus, the insulation withstand voltage between the source/drain regions 411a of the first MOS transistor and the source/drain regions 411b of the adjacent second MOS transistor abruptly lowers if the width of the isolation region 405 is not larger than 0.5 $\mu$m. As a result, reducing the isolation area will be limited by this fact.

Further, in the case of the trench type isolation area, its size (width) can be reduced to 0.1 $\mu$m or so by using the dry-etching technique. However, since a large difference in the thermal expansion coefficient is present between the insulating material filled in the trench and the semiconductor substrate, crystal defects will be likely to occur within the semiconductor substrate in the process of fabricating the semiconductor device.

SUMMARY OF THE INVENTION

It is, therefore, an object of the present invention to overcome the defects existing in the conventional device isolation area structure and to provide an improved device isolation area structure of a semiconductor device which is suitable to high integration and provides less occurrence of crystal defects.

According to one aspect of the present invention, there is provided a semiconductor device having a two-layer device isolation area structure, the structure comprising:

first device isolation insulating regions made of a first insulating film selectively formed on a surface of a semiconductor substrate; and second device isolation insulating regions made of a second insulating film selectively formed on the first insulating film in a semiconductor single crystal film which is provided so as to cover both the surface of the semiconductor substrate and the surfaces of the first device isolation insulating regions.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention will be explained with reference to the accompanying drawings.

First, referring to FIGS. 3 to 5, the first embodiment of the present invention will be explained below.

Figure 1:
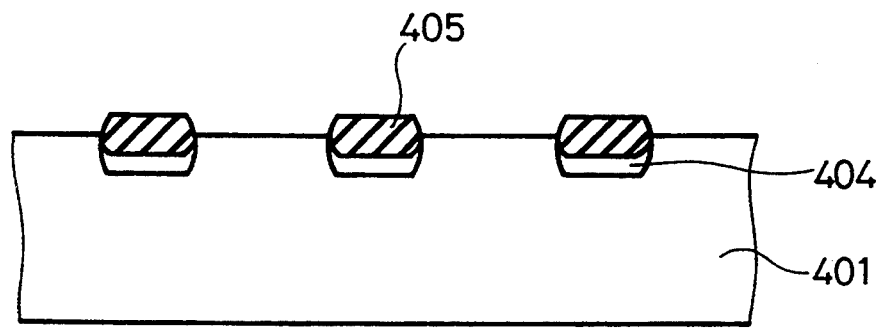
FIGS. 1 and 2 are sectional views for explaining the conventional semiconductor devices, respectively.
Figure 3:
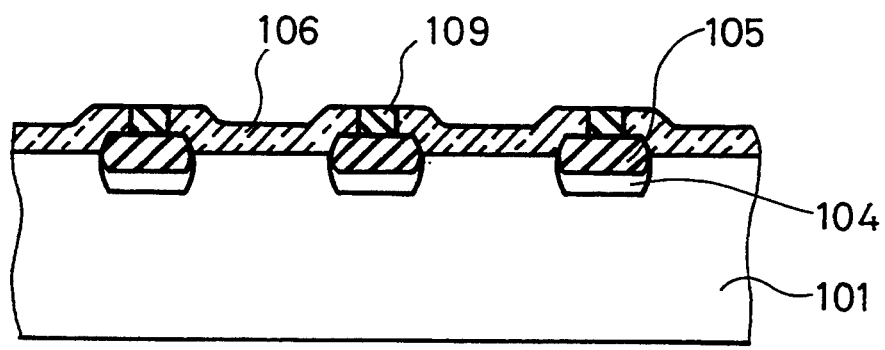
FIG. 3 is a sectional view for explaining the first embodiment of the present invention.

The semiconductor device according to this embodiment has the sectional structure as shown in FIG. 3. Namely, the device isolation area has a two-layer structure of a first device isolation area and a second device isolation area. Like the conventional LOCOS as shown in FIG. 1, each of the first device isolation regions comprises a channel stopper region 104 and a first device isolation insulating film (field oxide film) 105 which are formed on the surface of a P-type silicon substrate 101. A single crystal silicon film 106 is formed on the silicon substrate 101 and the first device isolation insulating films 105. A part of the single crystal silicon film 106 is removed on the neighborhood of the center of each of the field oxide films 105 so as to form a trench. Each of the second device isolation areas is formed by filling the trench with a second device isolation insulating film 109. The first device isolation insulating film 105 is about 0.6 μm wide and 100 nm~250 nm thick. The single crystal silicon film 106 is 10 nm~50 nm thick. The second device isolation insulating film 109 can be formed to have a width of 0.1 μm~0.5 μm.

Next, referring to FIGS. 4A to 4D, an explanation will be given on the fabrication process of the semiconductor device according to the first embodiment as shown in FIG. 3.

Figure 4A:
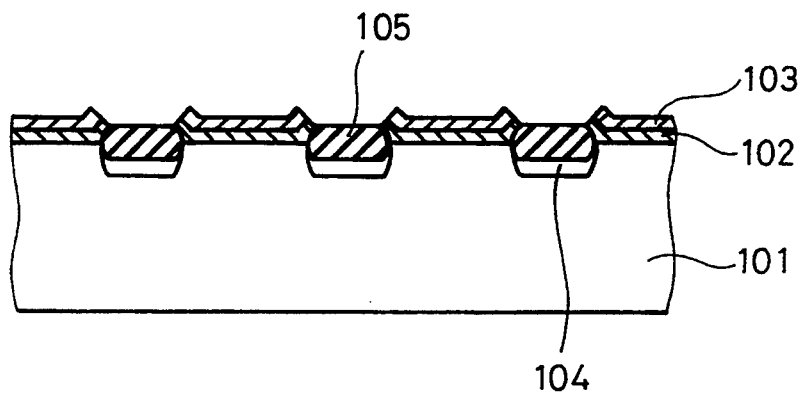
FIGS. 4A to 4D are sectional views for explaining, in a step order, a method of fabricating a semiconductor device according to the first embodiment of the present invention.

First, as shown in FIG. 4A, after a silicon oxide film 102 and a silicon nitride film 103 are stacked on the surface of the P-type silicon substrate 101, these stacked films are selectively removed by the known lithography and etching techniques. Subsequently, boron (B) is ion-implanted with the dose of $10^{12} \sim 10^{14}$ atoms/cm$^2$ to form channel stopper regions 104. The surface of the silicon substrate 101 is selectively oxidized to form first device isolation insulating films 105 made of a field oxide film about 200 nm thick.

Figure 4B:
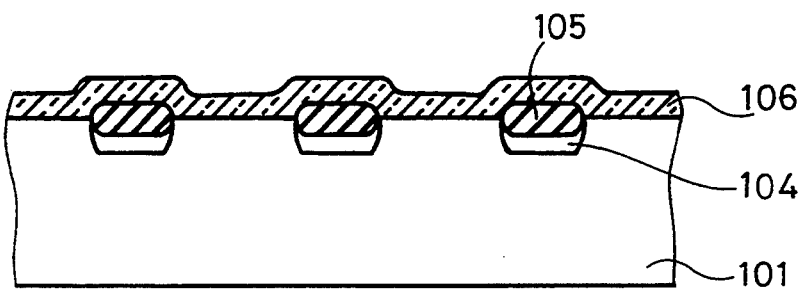

Then, as shown in FIG. 4B, the silicon nitride film 103 and the silicon oxide film 102 are successively removed so that the surface of the silicon substrate 101 other than the channel stopper regions 104 and the first device isolation insulating films 105 is cleansed and exposed to air. Successively, a single crystal silicon film 106 having a thickness of 10 nm~50 nm is formed on the resultant surface of the silicon substrate 101 in the following manner. Monosilane gas or disilane gas is thermally decomposed at the substrate temperature of 450° C.–550° C. to form an amorphous silicon film on the silicon substrate 101 surface. Thereafter, the silicon substrate 101 is heat-treated in an atmosphere of nitrogen gas to single-crystallize the amorphous silicon film. In this case, the cleansed surface of the silicon substrate 101 serves as a growth core, so that the amorphous silicon film becomes a single crystal silicon film 106 with high quality.

Figure 4C:
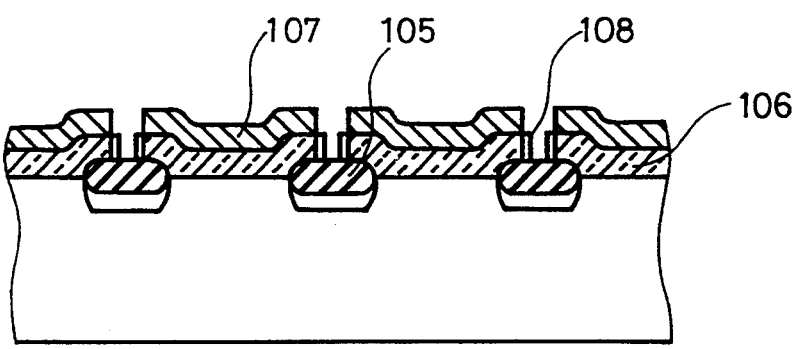

As shown in FIG. 4C, by using mask insulating films 107, the part of the single crystal film 106 is etched on the neighborhood of the center of each of the first device isolation insulating films 105 so as to form a trench. The etched trench may be 0.2 μm~0.3 μm wide.

Subsequently, the silicon substrate 101 is heat-treated in an atmosphere of oxygen gas to form spacer oxide films 108 on the exposed side walls of each of the trenches in the single crystal film 106. The mask insulating film 107 may be made of a silicon nitride film having a thickness of 5 nm~10 nm, or a two-layer insulating film consisting of the silicon nitride film and a silicon oxide film having a thickness of 2 nm or so. The reason that the etching position is located in the neighborhood of the center of each of the first device isolation insulating films 105 is as follows. The single crystal silicon films grown from both ends of the first device isolation film 105 meet with each other at this position, so that crystal defects are likely to occur and also grain boundaries are likely to remain. Hence, at least the single crystal film 106 at this position should be removed.

Figure 4D:
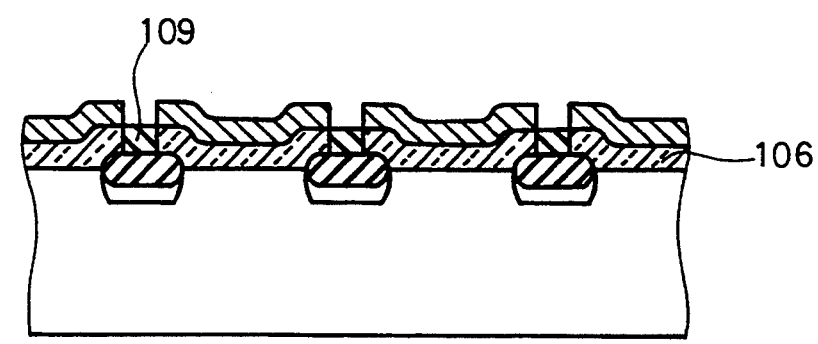

As shown in FIG. 4D, with a SOG film applied onto the surface of each of the trenches in the single crystal silicon film 106, the silicon substrate 101 is heat-treated in an atmosphere of oxygen gas at temperatures of about 800° C. so that a second device isolation insulating film 109 is formed in each trench. Without using the SOG film, the second device isolation insulating film 109 may be also formed in such a way that a silicon oxide film is deposited by CVD (chemical vapor deposition) method and etched back. Finally, the mask insulating film 107 is removed to accomplish the structure as shown in FIG. 3.

Figure 5:
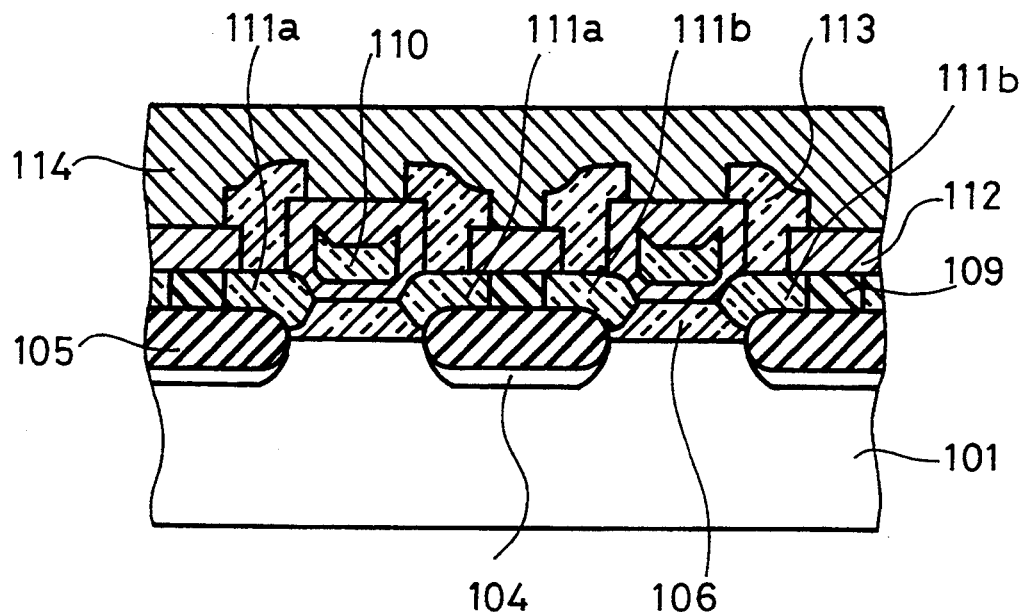
FIG. 5 is a sectional view of an application example of the first embodiment of the present invention.

FIG. 5 serves to explain the advantage of this embodiment when this embodiment is applied to a semiconductor device composed of MOS transistors. As seen from FIG. 5, after the structure shown in FIG. 3 is formed, gate oxide films, gate electrodes 110, source/drain regions 111a, 111b and an interlayer insulating film 112 are formed. After contact holes reaching the source/drain regions 111a, 111b are provided, electrode wirings 113 are formed and a cover film 114 is formed.

Figure 2:
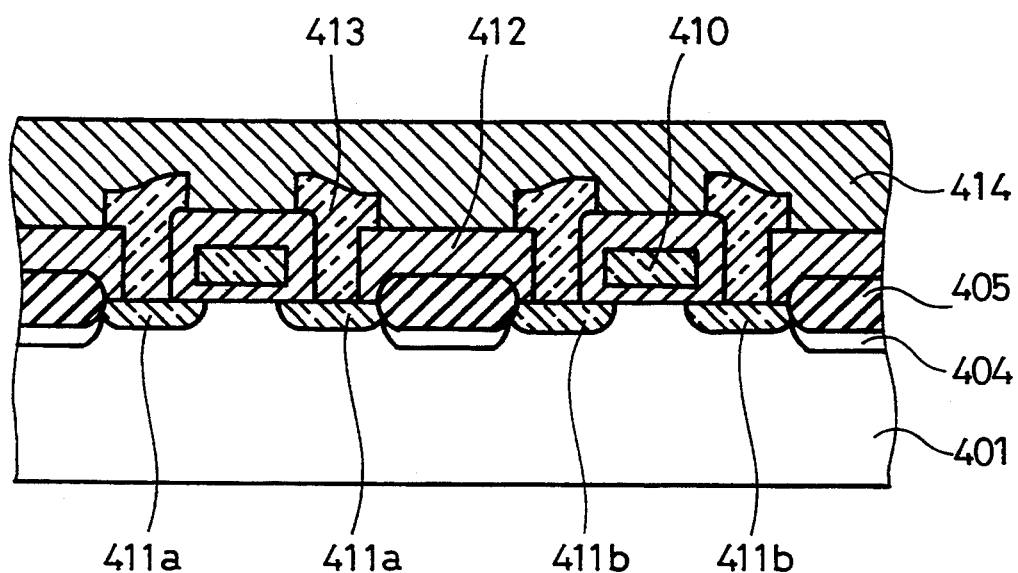

It should be noted in the structure shown in FIG. 5 that the source/drain regions 111a and 111b are formed within the single crystal film 106 unlike the conventional structure as shown in FIG. 2. For this reason, the source/drain regions 111a of the first MOS transistor and the source drain regions 111b of the second MOS transistor adjacent to the first MOS transistor are device-isolated by both the first device isolation insulating film 105 and the second device isolation insulating film 109. Thus, unlike the conventional semiconductor device as shown in FIG. 2, the insulating withstand voltage between the adjacent source/drain regions 411a and 411b will not be defined by the depletion layer which extends through the silicon substrate 401 below the field oxide film 405. In this embodiment, the distance between the source/drain regions 111a and 111b is defined by the width of the second device isolation insulating film 109, so that it can be reduced to 0.2 μm or so.

In this embodiment, the junction capacitance of the source/drain regions 111a and 111b can be also reduced greatly. Additionally, the desired thickness of the single crystal silicon film 106 is 50 nm or less which can greatly reduce the channel leakage current of the MOS transistor.

Figure 6:
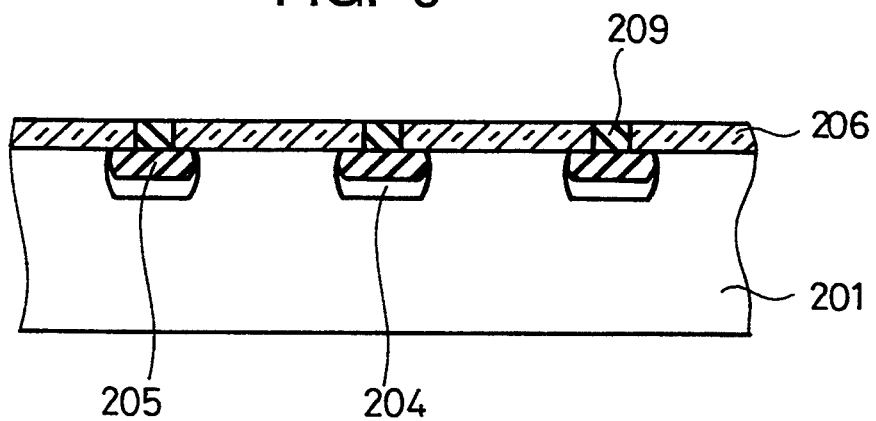
FIG. 6 is a sectional view for explaining the second embodiment of the present invention.

Next, referring to FIG. 6, a second embodiment of the present invention will be explained below. The structure according to this second embodiment is basically the same as that according to the first embodiment except that this embodiment is directed to a modified LOCOS structure.

The structure according to this embodiment is formed in the following manner. After the field oxide films having the LOCOS structure are formed on the surface of a P-type silicon substrate 201 by selective oxidation, they are removed and channel stopper regions 204 are formed at the removed portions. The substrate surface is selectively oxidized again thereby to form first device isolation insulating films 205 made of the field oxide film having the modified LOCOS structure as shown in FIG. 6. In another method for making the modified LOCOS structure, grooves each having a reversed-trapezoidal shape are selectively formed in the surface of the silicon substrate 201 by anisotropic wet-etching, and the channel stopper regions 204 are formed in the grooves. The substrate surface is selectively oxidized for the grooves thereby to form the first device isolation insulating films 205 made of the field oxide film having the modified LOCOS structure. In the same manner as in the first embodiment, a single crystal silicon film 206 and second device isolation insulating films 209 are successively formed.

This embodiment has the same advantage or meritorious effect as the first embodiment. In addition, in this second embodiment, the surface of the silicon substrate 201 and the surfaces of the first device isolation films 205 are smoothed so as to be substantially coplanar, so that the single crystal silicon film 206 is also smoothed. Hence, this embodiment has also an advantage that semiconductor devices can be easily formed on the single crystal silicon film 206.

Lastly, referring to FIGS. 7 to 9, the third embodiment of the present invention will be explained below. FIG. 9 shows a change in the gettering amount of heavy metal versus the impurity concentration in a guard band.

Figure 7:
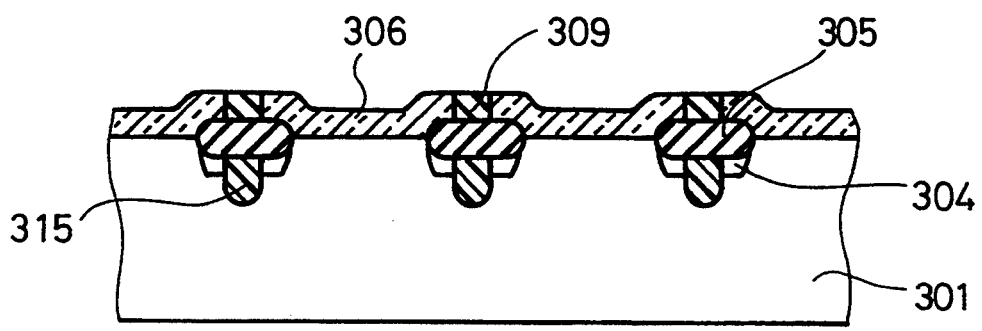
FIG. 7 is a sectional view for explaining the third embodiment of the present invention.

The semiconductor device according to this third embodiment has the sectional structure as shown in FIG. 7 which is substantially the same as that of the first embodiment shown in FIG. 3. Specifically, as shown in FIG. 7, formed at the surface of a silicon substrate 301 are channel stopper regions 304, first device isolation areas made of first device isolation insulating films 305, a single crystal silicon film 306 and second device isolation areas made of second device isolation insulating films 309. However, this third embodiment is different from the first embodiment in that a guard band region 315 is formed immediately below each of the first device isolation insulating films 305 and inside the ends thereof so as to penetrate through the channel stopper region 304. It should be noted that the guard band region 315 is highly doped with impurities of boron (B) or oxygen (O). The first device isolation insulating film 305 has a thickness of 50 nm~200 nm and a width of 0.4 μm~0.5 μm. The impurity concentration of oxygen or boron of the guard band region 315 is preferably $1 \times 10^{18}$ atoms/cm$^3$~$5 \times 10^{18}$ atoms/cm$^3$, and the depth thereof is 0.5 μm~1.0 μm.

Figure 8A:
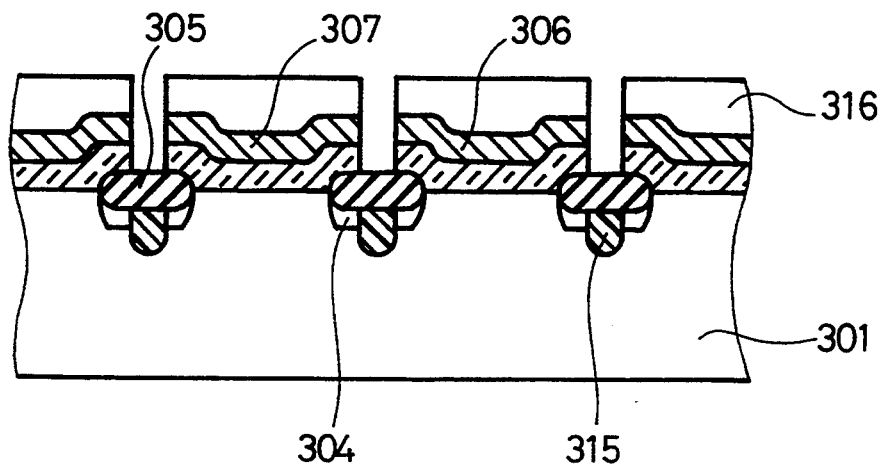
FIGS. 8A to 8C are sectional views for explaining, in a step order, a method of fabricating the semiconductor device according to the third embodiment of the present invention.
Figure 8B:
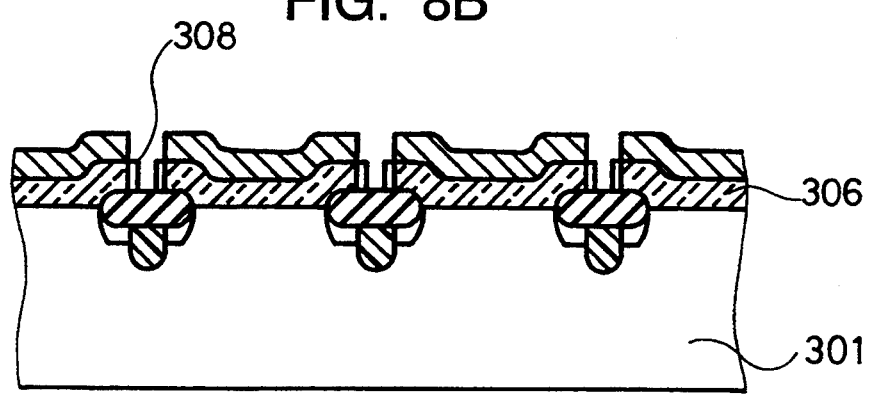
Figure 8C:
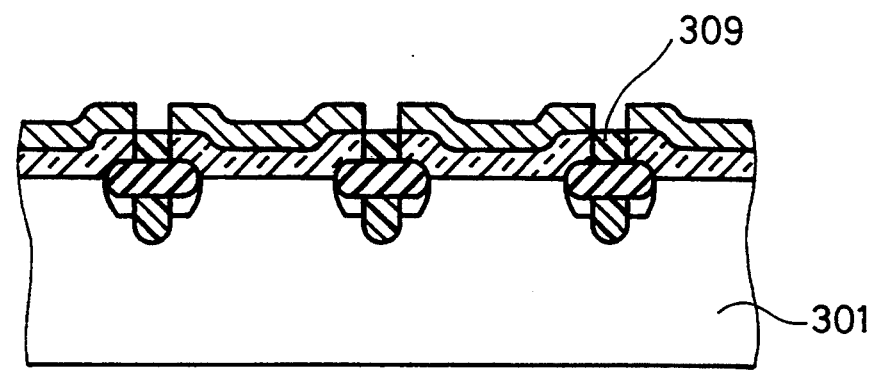
Figure 9:
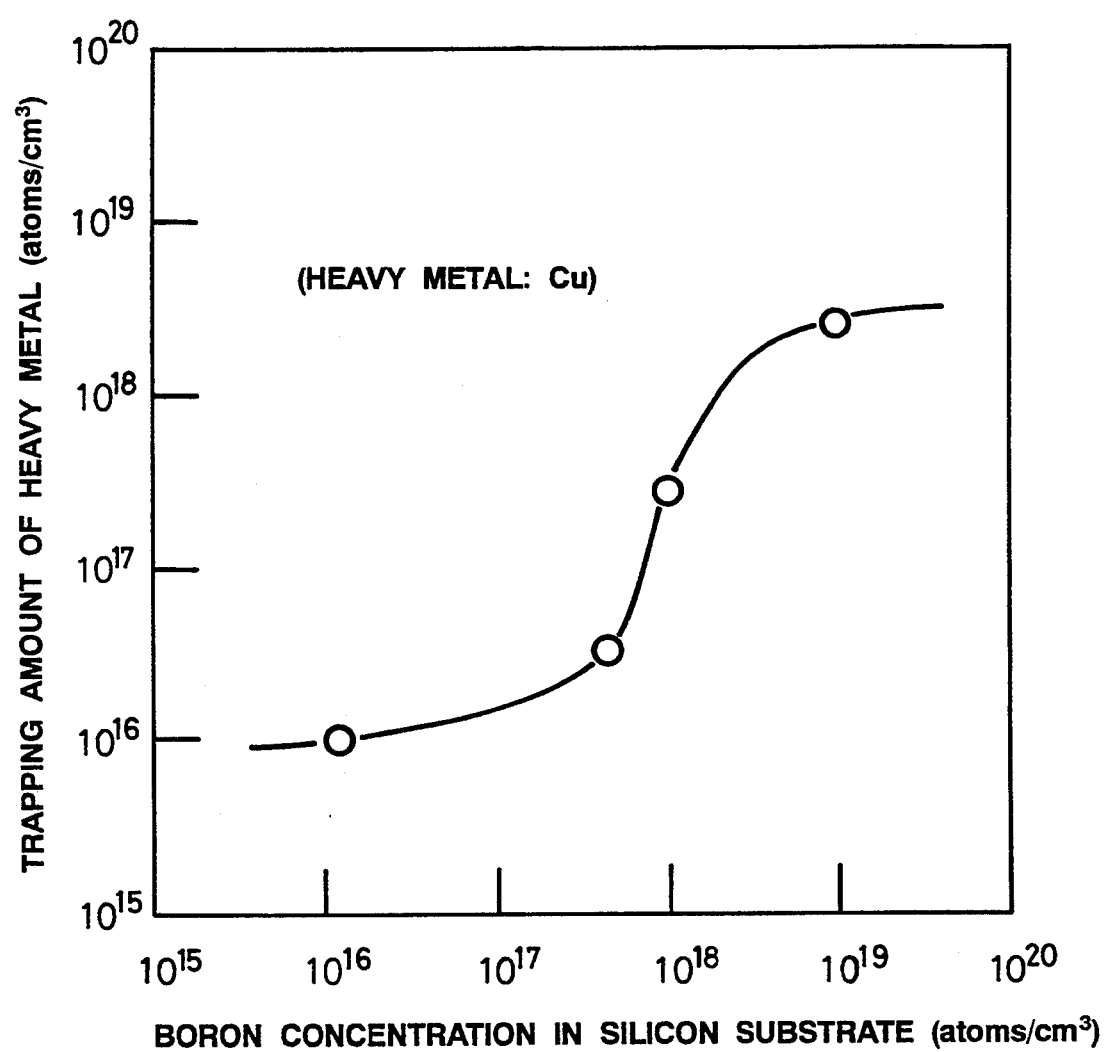
FIG. 9 is a graph showing the advantage of the third embodiment of the present invention.

Referring to FIGS. 8A to 8C, an explanation will be given on the method of fabricating a semiconductor device according to this third embodiment.

First, as shown in FIG. 8A, in the same manner as in the first embodiment, the fabrication process to provide a single crystal silicon film 306 and a mask insulating film 307 is performed. In this case, it should be noted that the thickness of the first device isolation insulating film 305 is made smaller than that in the first embodiment shown in FIG. 3. Subsequently, a photoresist mask 316 is formed on the mask insulating film 307. By Using the photoresist mask 316, portions of the mask insulating film 307 and the single crystal film 306 corresponding to the neighborhood of the center of each of the first device isolation films 305 are successively etched away to form a trench. Boron (B) is ion-implanted under the conditions of an implant energy of 100~150 KeV and a dose amount of $1 \sim 5 \times 10^{14}$ atoms/cm$^2$ whereby a guard band region 315 is formed.

Next, as shown in FIG. 8B, after the resist 316 is removed, the side walls of each of the trenches with the single crystal film 306 exposed is thermally oxidized to form space oxide films 308.

Lastly, as shown in FIG. 8C, each of the trenches is filled with a second device isolation insulating film 309 to form a second device isolation area. Finally, the mask insulating film 307 is removed thereby to complete the semiconductor device shown in FIG. 7.

This embodiment has also the same advantage as the first embodiment. In addition, this third embodiment has the following two advantages because of the provision of the guard band regions 315.

(1) When the guard band regions are formed by ion-implanting boron or oxygen with a high impurity concentration, crystal defects do not occur easily. Hence, the first device isolation insulating film 305 is made thinner than in the first embodiment. This permits the semiconductor device to be further miniaturized. The upper limit of the impurity concentration is $5 \times 10^{18}$ atoms/cm$^3$. If the impurity concentration exceeds this limit, crystal dislocation becomes likely to occur. The usual thickness of the first device isolation film (field oxide film) is about 60 nm. Then, the corresponding impurity concentration of the channel stopper region is about $10^{17}$ atoms/cm$^3$.

(2) The guard band region 315 can be used as a gettering region for polluted heavy metal. FIG. 9 shows the gettering effect in the case where the guard band region is doped with boron (B) and the heavy metal is copper (Cu). As seen from the FIG. 9 graph, the gettering effect is remarkable in the range where the impurity concentration of boron is not less than $1 \times 10^{18}$/cm$^3$. The same effect can be obtained for the heavy metals other than copper. The guard band region doped with oxygen in place of boron provides the same effect. Since the guard band region absorbs the heavy metal contained in the region where a device is to be formed, the characteristics of the semiconductor device such as its junction withstand voltage, junction leakage current and holding characteristic can be improved.

Although the above explained first to third embodiments have been directed to the case where the substrate is a P-type silicon, the substrate may be an N-type silicon provided that phosphorus (P) or arsenic (As) is used in place of boron (B).

As has been described hereinabove, the present invention adopts a two-layer structure for the device isolation between devices or elements of a semiconductor device, i.e., two-layers consisting of a first device isolation insulating film formed by selectively oxidizing a semiconductor substrate surface and a second device isolation insulating film formed on a semiconductor film covering the first device isolation film. In accordance with the present invention, therefore, the necessary device isolation area can be reduced, so that the semiconductor device can be fabricated with a higher integration degree. The present invention can also provide a device isolation area with introduction of crystal defects reduced.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device isolation area structure comprising:
    first device isolation insulating regions each made of a first insulating film and each located at a predetermined location at a surface of a semiconductor substrate;
    second device isolation insulating regions each made of a second insulating film and each located on respective first device isolation insulating regions and in an aperture of a semiconductor single crystal silicon film which is provided so as to cover both the surface of said semiconductor substrate and the surface of said first device isolation insulating region, said semiconductor single crystal silicon film being directly in contact with said semiconductor substrate, wherein said first and second device isolation insulating regions isolate areas of said semiconductor substrate from one another;

channel stopper regions; and guard band regions each located within said semiconductor substrate and immediately below each of said first device isolation insulating regions so as to be in contact with each of said first device isolation insulating regions, said guard band regions being doped with an element selected from a group consisting of boron and oxygen.

2. A semiconductor device isolation area structure according to claim 1, wherein a surface of said semiconductor substrate and said first device isolation insulating regions are substantially coplanar.

3. A semiconductor device isolation area structure according to claim 1, wherein said guard band regions are narrower in width than that of said first device isolation insulating regions.

4. A semiconductor device isolation area structure comprising:

first device isolation regions each made of a first insulating film and each located at a predetermined location at a surface of a semiconductor substrate;

second device isolation regions each made of a second insulating film and each located on said first device isolation region and in an aperture of a semiconductor single crystal silicon film which is provided so as to cover both the surface of said semiconductor substrate and the surface of said first device isolation insulating region, wherein said first and second device isolation insulating regions isolate semiconductor devices of said semiconductor substrate from one another; and guard band regions each located within said semiconductor substrate and immediately below each of said first device isolation insulating regions so as to be in contact with each of said first device isolation insulating regions, said guard band regions being doped with one element selected from a group consisting of boron and oxygen, wherein the impurity concentration of said one of boron and oxygen at said guard band region has a range between $1 \times 10^{18}$ atoms/cm$^3$ and $5 \times 10^{18}$ atoms/cm$^3$.

5. A semiconductor device isolation area structure comprising:

first device isolation regions each made of a first insulating film and each located at a predetermined location at a surface of a semiconductor substrate;

second device isolation regions each made of a second insulating film and each located on said first device isolation region and in an aperture of a semiconductor single crystal silicon film which is provided so as to cover both the surface of said semiconductor substrate and the surface of said first device isolation insulating region, wherein said first and second device isolation insulating regions isolate semiconductor devices of said semiconductor substrate from one another; and wherein each of said first device isolation insulating regions is about 0.6 μm in width and 100 nm to 250 nm in thickness, and each of said second device isolation insulating regions is 0.1 μm to 0.5 μm in width and 10 nm to 50 nm in thickness.

6. A semiconductor device isolation area structure comprising:

first device isolation insulating regions each made of a first insulating film and each located at a predetermined location at a surface of a semiconductor substrate;

second device isolation insulating regions each made of a second insulating film and each located on respective first device isolation insulating regions and in an aperture of a semiconductor single crystal silicon film which is provided so as to cover both the surface of said semiconductor substrate and the surface of said first device isolation insulating region, wherein said first and second device isolation insulating regions isolate areas of said semiconductor substrate from one another;

channel stopper regions; and guard band regions each located within said semiconductor substrate and immediately below each of said first device isolation insulating regions so as to be in contact with each of said first device isolation insulating regions, said guard band regions being doped with an element selected from a group consisting of boron and oxygen;

wherein:

said channel stopper regions abut said first device isolation insulating regions, and said guard band regions each extend through a respective channel stopper region.

7. A semiconductor device isolation area structure comprising:

first device isolation insulating regions each made of a first insulating film and each located at a predetermined location at a surface of a semiconductor substrate;

second device isolation insulating regions each made of a second insulating film and each located on respective first device isolation insulating regions and in an aperture of a semiconductor single crystal silicon film which is provided so as to cover both the surface of said semiconductor substrate and the surface of said first device isolation insulating region, wherein said first and second device isolation insulating regions isolate areas of said semiconductor substrate from one another;

channel stopper regions; and guard band regions each located within said semiconductor substrate and immediately below each of said first device isolation insulating regions so as to be in contact with each of said first device isolation insulating regions, said guard band regions being doped with an element selected from a group consisting of boron and oxygen;

wherein a doping concentration of said element has a range between $1 \times 10^{18}$ atoms/cm$^3$ and $5 \times 10^{18}$ atoms/cm$^3$.

8. A semiconductor device isolation area structure comprising:

first device isolation insulating regions each made of a first insulating film and each located at a predetermined location at a surface of a semiconductor substrate;

second device isolation insulating regions each made of a second insulating film and each located on respective first device isolation insulating regions and in an aperture of a semiconductor single crystal silicon film which is provided so as to cover both the surface of said semiconductor substrate and the surface of said first device isolation insulating region, wherein said first and second device isolation insulating regions isolate areas of said semiconductor substrate from one another;

channel stopper regions; and guard band regions each located within said semiconductor substrate and immediately below each of said first device isolation insulating regions so as to be in contact with each of said first device isolation insulating regions, said guard band regions being doped with an element selected from a group consisting of boron and oxygen;

wherein each of said first device isolation insulating regions have a width of about 0.6 $\mu$m and a thickness between about 100 nm and 250 nm, and each of said second device isolation insulating regions have a width of about 0.6 $\mu$m and a thickness of between about 10 nm and 50 nm.

9. A semiconductor device isolation area structure comprising:

first device isolation insulating regions each made of a first insulating film and each located at a predetermined location at a surface of a semiconductor substrate;

second device isolation insulating regions each made of a second insulating film and each located on respective first device isolation insulating regions and in an aperture of a semiconductor single crystal silicon film which is provided so as to cover both the surface of said semiconductor substrate and the surface of said first device isolation insulating region, wherein said first and second device isolation insulating regions isolate areas of said semiconductor substrate from one another;

channel stopper regions; and guard band regions each located within said semiconductor substrate and immediately below each of said first device isolation insulating regions so as to be in contact with each of said first device isolation insulating regions, said guard band regions being doped with an element selected from a group consisting of boron and oxygen;

wherein a depth of said guard band regions is about 0.5 $\mu$m to 1.0 $\mu$m.

* * * * *